(12) United States Patent
Brown et al.

(10) Patent No.: US 10,490,399 B2
(45) Date of Patent: Nov. 26, 2019

(54) SYSTEMS AND METHODOLOGIES FOR VAPOR PHASE HYDROXYL RADICAL PROCESSING OF SUBSTRATES

(71) Applicant: Tokyo Electron Limited, Tokyo (JP)

(72) Inventors: Ian J. Brown, Portland, OR (US); Wallace P. Printz, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 101 days.

(21) Appl. No.: 15/452,832

(22) Filed: Mar. 8, 2017

(65) Prior Publication Data

US 2017/0263436 A1 Sep. 14, 2017

Related U.S. Application Data

(60) Provisional application No. 62/305,715, filed on Mar. 9, 2016.

(51) Int. Cl.
| | |
|---|---|
| *H01L 21/02* | (2006.01) |
| *B08B 5/00* | (2006.01) |
| *B08B 7/00* | (2006.01) |
| *B08B 7/04* | (2006.01) |
| *H01L 21/67* | (2006.01) |
| *H01L 21/311* | (2006.01) |

(52) U.S. Cl.
CPC ............ *H01L 21/0206* (2013.01); *B08B 5/00* (2013.01); *B08B 7/0057* (2013.01); *B08B 7/04* (2013.01); *H01L 21/31122* (2013.01); *H01L 21/31138* (2013.01); *H01L 21/67023* (2013.01)

(58) Field of Classification Search
None
See application file for complete search history.

(56) References Cited

U.S. PATENT DOCUMENTS

| | | | | |
|---|---|---|---|---|
| 5,269,850 | A | * 12/1993 | Jackson | C11D 3/3942 134/1 |
| 2012/0285492 | A1 | * 11/2012 | Lee | H01L 21/0206 134/31 |
| 2014/0144463 | A1 | * 5/2014 | Brown | H01L 21/67051 134/1.3 |

* cited by examiner

*Primary Examiner* — Eric W Golightly
(74) *Attorney, Agent, or Firm* — Oblon, McClelland, Maier & Neustadt, L.L.P.

(57) ABSTRACT

An apparatus and method for processing substrates. The method includes positioning a substrate within a processing chamber of a substrate processing system. The substrate includes a layer of a carbon-containing material on a working surface of the substrate. The method also includes receiving hydrogen peroxide vapor in a vapor treatment region of the substrate processing system, generating hydroxyl radical vapor by treating the hydrogen peroxide vapor in the vapor treatment region, and directing the hydroxyl radical vapor and remaining hydrogen peroxide vapor to the working surface of the substrate causing the carbon-containing material to be chemically modified.

15 Claims, 8 Drawing Sheets

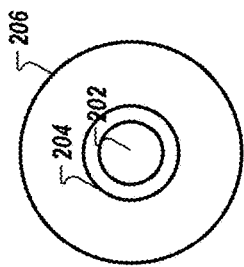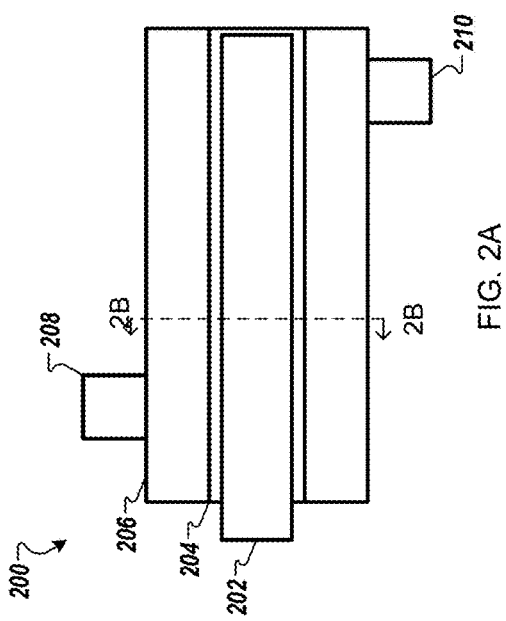

SYSTEMS AND METHODOLOGIES FOR VAPOR PHASE HYDROXYL RADICAL PROCESSING OF SUBSTRATES

CROSS-REFERENCE TO RELATED APPLICATIONS

This application claims the benefit of priority from U.S. Provisional Application No. 62/305,715 filed Mar. 9, 2016, the entire contents of which are incorporated herein by reference.

BACKGROUND

This disclosure relates to processing of semiconductor materials, and, in particular, to methods, systems, and apparatuses for cleaning and material removal.

Fabrication of integrated circuits and semiconductor devices can involve many different types of processing techniques. Such techniques generally involve patterning a substrate and using the pattern to make various sacrificial and/or permanent structures. For example, photolithography can be used to create patterned layers using a thin layer of radiation-sensitive material, such as photoresist. This radiation-sensitive layer is transformed into a patterned mask that can be used to etch or transfer a pattern into one or more underlying layers on a substrate. Thus, the patterned layer of photoresist can act as a mask for directional (i.e., anisotropic) etching of one or more underlying layers. Any of various materials can be patterned, including oxides, organic materials, hardmasks, metals, and the like.

Fabrication of integrated circuits and semiconductor devices can be a cyclical process of depositing materials, modifying materials, patterning materials, and removing materials. It is common to have a need to remove one type of material without removing other types of materials on a given substrate. Various cleaning processes can be implemented to selectively remove or clean materials off of a given substrate. Such cleaning processes can include both wet cleaning techniques (e.g., reactive liquid chemicals) and dry cleaning techniques (e.g., plasma-based cleaning) using particular chemistries and/or physical mechanisms to clean or remove materials from a substrate.

The foregoing "Background" description is for the purpose of generally presenting the context of the disclosure. Work of the inventor, to the extent it is described in this background section, as well as aspects of the description which may not otherwise qualify as prior art at the time of filing, are neither expressly or impliedly admitted as prior art against the present invention.

SUMMARY

An aspect of the present disclosure includes a method for processing substrates. The method includes positioning a substrate within a processing chamber of a substrate processing system. The substrate includes a layer of a carbon-containing material on a working surface of the substrate. The method also includes receiving hydrogen peroxide vapor in a vapor treatment region of the substrate processing system, generating hydroxyl radical vapor by treating the hydrogen peroxide vapor in the vapor treatment region, and directing the hydroxyl radical vapor and remaining hydrogen peroxide vapor to the working surface of the substrate causing the carbon-containing material to be chemically modified.

Another aspect of the present disclosure includes a substrate processing system. The system includes a processing chamber configured to hold a substrate. The substrate includes a layer of a carbon-containing material on a working surface of the substrate. The substrate processing system also includes a hydroxyl radical vapor generating system configured to receive hydrogen peroxide vapor, generate hydroxyl radical vapor from the hydrogen peroxide vapor, and direct the hydroxyl radical vapor and remaining hydrogen peroxide vapor to the working surface of the substrate causing the carbon-containing material to be chemically modified.

Another aspect of the present disclosure includes an apparatus for substrate cleaning in a substrate processing system. The apparatus includes an inlet configured to receive hydrogen peroxide vapor, an ultraviolet (UV) source configured to expose the hydrogen peroxide vapor to sufficient UV radiation to generate hydroxyl radical vapor; and an outlet configured to direct the hydroxyl radical vapor and the remaining hydrogen peroxide vapor to a substrate, the substrate including a layer of a carbon-containing material on a working surface of the substrate, causing the carbon-containing material to be chemically modified.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 2A is a schematic diagram of a vapor treatment system according to one example;

FIG. 2B is a schematic diagram that shows a side view of the system of FIG. 2A;

DETAILED DESCRIPTION

Figure 1:
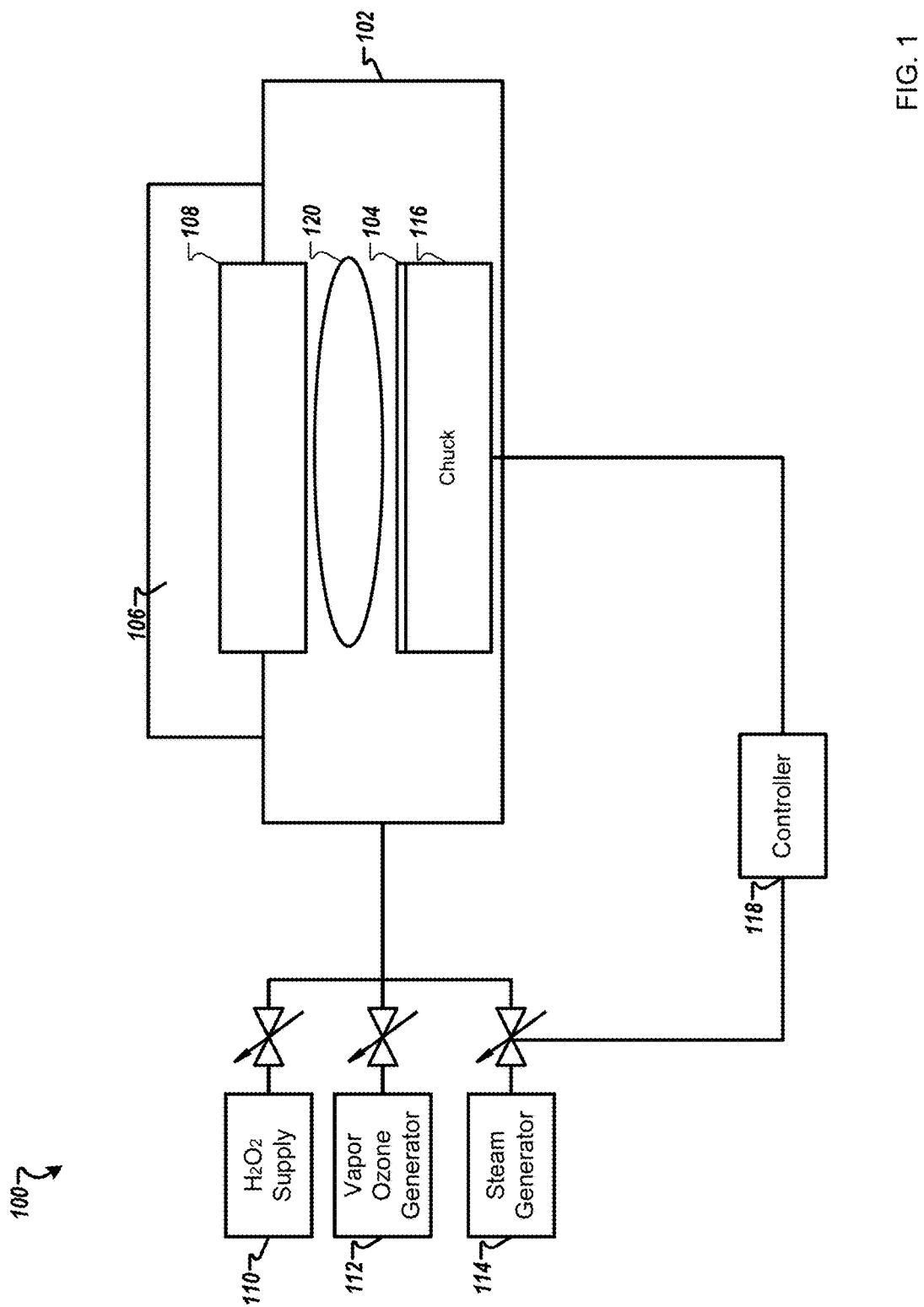
FIG. 1 is a schematic diagram of a system for processing substrates according to one example.

Referring now to the drawings, wherein like reference numerals designate identical or corresponding parts throughout several views, the following description relates to a system and associated methodology for vapor phase hydroxyl radical processing of substrates.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Techniques described herein provide a low-damage oxidation process that does not rely on using plasma or high process temperatures (i.e., above 150° C.). Techniques include generation of hydroxyl radical vapor in high concentrations for removal of carbon-containing films. A flow of high-concentration hydrogen peroxide can be exposed to ultraviolet (UV) radiation prior to reaching a substrate surface to generate a high-concentration of hydroxyl radical vapor. Such oxidation techniques can provide a dry oxidation process for processing of semiconductor and flat panel substrates. Typically, oxidation cleaning or oxidation treatment processes rely on oxidizing plasma or high temperature oxidizing wet chemistry e.g., sulfuric acid and hydrogen peroxide mixtures (SPM), Standard Clean 1 (SC1)(organic clean+particle clean), $H_2O_2$, or thermal treatment in an oxidizing atmosphere. The reactivity of hydrogen peroxide can be increased by heating the peroxide and/or the substrate, but a disadvantage is that hydrogen peroxide is sensitive to thermal decomposition into water and oxygen.

In terms of reactivity, hydroxyl radicals, HO., are significantly more oxidizing than $H_2O_2$ alone. One advantage of using a reactant of more oxidizing potential allows removal of films that are less susceptible to removal under less-oxidizing conditions. Furthermore, use of a more-oxidizing reactant will decrease the necessary processing time to remove a target film as compared to the processing time using less-oxidizing reactants. Table I shows oxidation potential of various oxidizing species, and highlights the difference in oxidation potential between hydroxyl radicals and hydrogen peroxide. Accordingly, the reactivity of hydrogen peroxide vapor can be increased by converting the hydrogen peroxide vapor to hydroxyl radical vapor.

TABLE 1

| Oxidation potential (V) | |
| --- | --- |
| Oxidizing Species | Oxidation Potential (V) |
| Fluorine ($F_2$) | 3.0 |
| Hydroxyl Radical (HO•) | 2.7 |
| Singlet Oxygen (O) | 2.4 |
| Ozone ($O_3$) | 2.1 |
| Oxygen ($O_2$) | 1.2 |
| Peroxide ($H_2O_2$) | 1.8 |

FIG. 1 is a schematic diagram of a system 100 for processing substrates according to one example. The system 100 may include semiconductor furnaces, single wafer processing systems, etch systems (e.g., plasma-processing systems), and cleaning tools. The system 100 may include a processing chamber 102, inside which a substrate holder 116 is disposed, such an electrostatic chuck, for receiving a substrate 104. The substrate holder 116 may be a temperature controlled chuck.

The substrate 104 includes a layer of carbon-containing material on a working surface of the substrate 104. This layer can be removed or treated by processes described herein. The layer of carbon-containing material is selected from a group consisting of amorphous carbon, photoresist, spin-on-carbon, or carbon-containing byproducts of semiconductor processing unit operations. For example, films can include carbon films such as chemical vapor deposition of amorphous carbon, as well as spin-on-carbon (SOC). Various photoresists can be used including ion implanted photoresists. Etch byproducts films can also be treated such as post-etch polymer.

Hydrogen peroxide vapor is received in a vapor treatment region 120 of the substrate processing system 100. Such hydrogen peroxide vapor can be provided in high concentration such as 5000-150,000 ppm. Various hydrogen peroxide generators can be used that produce high concentrations of dry $H_2O_2$ or $H_2O_2/H_2O$ vapors at vacuum to atmospheric pressures. Exemplary hydrogen peroxide vapor generators are produced by RASIRC of San Diego, Calif. Such vapor generators can provide higher concentrations of hydrogen peroxide compared to equilibrium vapor concentrations of hydrogen peroxide to water vapor. The vapor treatment region 120 can be an area within the substrate processing chamber 102 above a working surface of the substrate 104, or within a chamber or tube adjacent to the substrate processing chamber 102 or outside of the substrate processing chamber 102.

Hydroxyl radical vapor is generated by treating the hydrogen peroxide vapor in the vapor treatment region 120. Treating the hydrogen peroxide vapor includes exposing the hydrogen peroxide vapor to ultraviolet radiation. Oxidation performance of the hydrogen peroxide vapor can be increased by exposing the hydrogen peroxide vapor to UV light to crack the hydrogen peroxide into hydroxyl radical vapor. The hydroxyl radicals can then be used as generated for direct oxidation reactions on the substrate surface, or produced in presence of other gases to create organic radicals or organic peroxides. Thus, hydroxyl radicals can substantially reduce oxidation process time, improving throughput. Hydroxyl radical vapor can be generated in-situ in the substrate processing chamber or in a separate region prior to entering the processing chamber. Some substrates can be sensitive to UV light, and so generating hydroxyl radical vapor in an adjacent region that contains UV light exposure, can be beneficial.

Referring back to FIG. 1, a high-concentration hydrogen peroxide vapor can be flowed into the substrate processing chamber 102. The substrate processing chamber 102 can include one or more UV sources 106, such as UV lamps, which can be placed behind a UV transparent window 108. As hydrogen peroxide vapor is flowed toward the substrate from a $H_2O_2$ generator 110, UV radiation interacts with the hydrogen peroxide vapor and forms hydroxyl vapor, which is then flowed toward the substrate. The system may further include a vapor ozone generator 112 and a steam generator 114. The $H_2O_2$ generator 110, the vapor ozone generator 112, the steam generator 114, and the temperature controlled-substrate holder 116 may be controlled by a controller 118 to adjust various parameters of the system 100.

Materials on some substrates are sensitive to UV radiation and/or could be damaged by UV radiation. Thus, the configuration illustrated in FIG. 1 may be non-preferred in some cases because UV radiation can reach the working surface of the substrate. In other embodiments, the vapor treatment region can be located adjacent to the substrate processing chamber 102 or just outside of the processing chamber so that hydroxyl radical vapor can be generated with UV radiation, the hydroxyl radical vapor can then be delivered to the processing chamber but without UV radiation reaching the substrate.

FIG. 2A is a schematic diagram of a vapor treatment system 200 according to one example. A UV light source 202 that generates 254 nanometer wavelengths is an elongated UV source surrounded by UV transparent material. In this example, a quartz tube 204 surrounds the UV light source 202. An outside tube 206 (which can include UV reflective material) provides a conduit for flowing hydrogen peroxide vapor past/around the UV light source 202. The hydrogen peroxide and a UV transparent carrier gas (e.g., nitrogen) may be introduced via inlet 208. The UV transparent carrier gas can carry wet or dry hydrogen peroxide vapor through the conduit to be exposed to the UV light source 202. Such UV exposure then cracks the hydrogen peroxide to generate hydroxyl radicals, which can then be flowed to a working surface of the substrate via outlet 210.

FIG. 2B is a schematic diagram that shows a side cross section view of the system of FIG. 2A.

Figure 3:
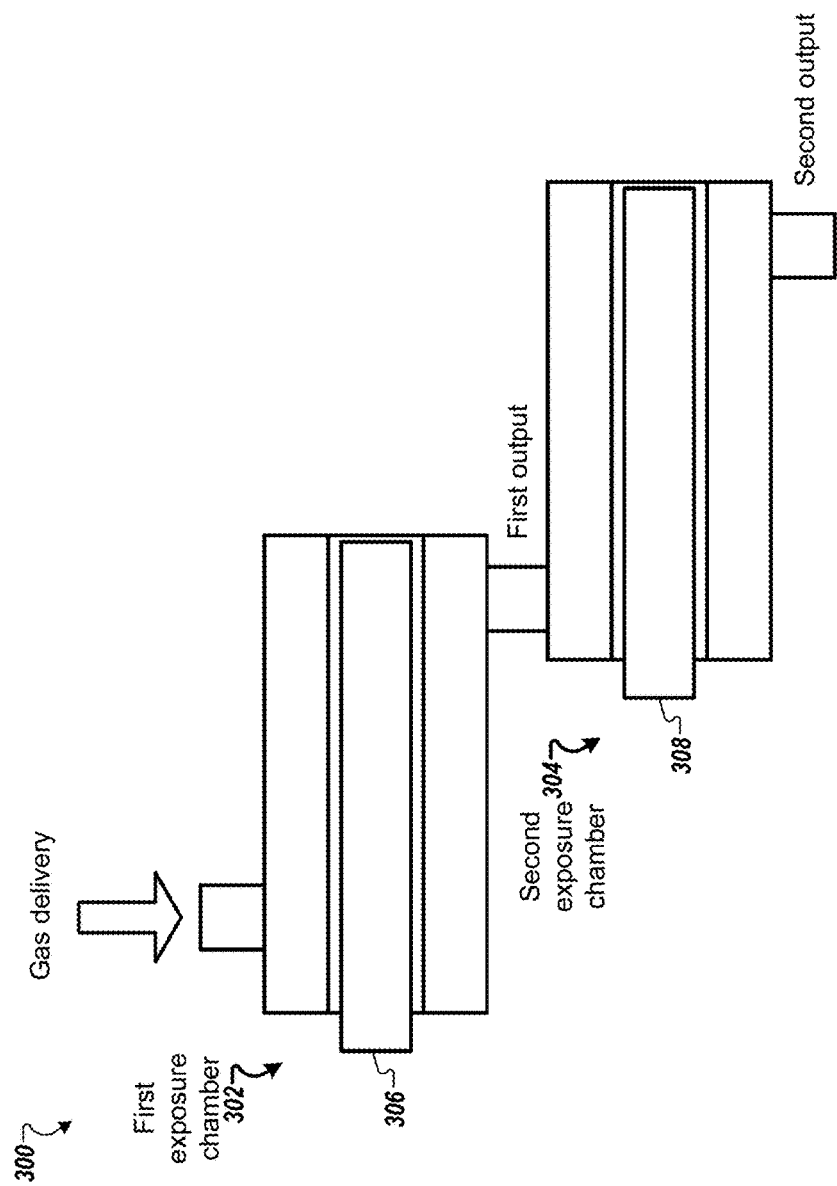
FIG. 3 is a schematic diagram of a system for processing substrates having multiple ultraviolet (UV) exposure chambers according to one example.

FIG. 3 is a schematic diagram of a system 300 for processing substrates using multiple UV exposure chambers according to one example. Different UV light sources can be used to further increase the concentration of hydroxyl radicals generated. Multiple UV exposure chambers and/or UV light sources can be used for generating hydroxyl radicals. In one embodiment, the system may include a first exposure chamber 302 and a second exposure chamber 304. The first exposure chamber 302 may include a first UV source 306 with a first wavelength, for example, 185 nm or 172 nm. The second exposure chamber 304 may include a second UV source 308 with a second wavelength, for example, 254 nm. The hydrogen peroxide is introduced to the first exposure chamber 302 and the output from the first exposure chamber (e.g., $H_2O_2$, $O_2$, $H_2O$, HO., $O_3$, O) is directed to the input of the second exposure chamber 304. The output from the second exposure chamber (e.g., $H_2O_2$, $O_2$, $H_2O$, HO.) then directed to the substrate processing chamber.

The selection of the sequence of each exposure chamber's wavelength in a multi-exposure processing configuration is determined as a function of the lifetime of the radicals. For example, if atomic oxygen (O) is more reactive than Ozone ($O_3$), then it is beneficial to generate atomic oxygen last in sequence (i.e., in the last exposure chamber before the substrate processing chamber) in order to increase the reactive concentration at the substrate surface as otherwise a higher percentage of O may have reacted elsewhere before reaching the substrate.

$H_2O_2$ strongly absorbs at 254 nm, and splits into hydroxyl radicals. $O_3$ is also strongly absorbing at 254 nm and may create atomic oxygen (O) and diatomic oxygen ($O_2$). If $O_2$ is present, 185 nm or 172 nm light can cleave the $O_2$ molecule to create atomic oxygen. The atomic oxygen itself is reactive with the substrate or reacts with oxygen to form ozone. Ozone is more reactive than oxygen. If $H_2O_2$/Nitrogen mixture was used then only exposure chamber with a wavelength of 254 nm are used. If carrier gas is air then exposure chambers with shorter wavelengths may be used to enhance the reactivity of the gas.

Note that having the UV light source positioned within in a tube and flowing hydrogen peroxide around the tube is just one example configuration. For example, the UV source can be located around a conduit within which the hydrogen peroxide vapor is flowed. Various geometries can be used for the conduit or a pre-exposure chamber prior to entering the substrate processing chamber.

In one implementation, Hydroxyl radical vapors can be generated within the substrate processing chamber while minimizing danger of UV damage to the substrate. Specifically, UV-light can be directed so as to minimize substrate exposure to UV.

Figure 4:
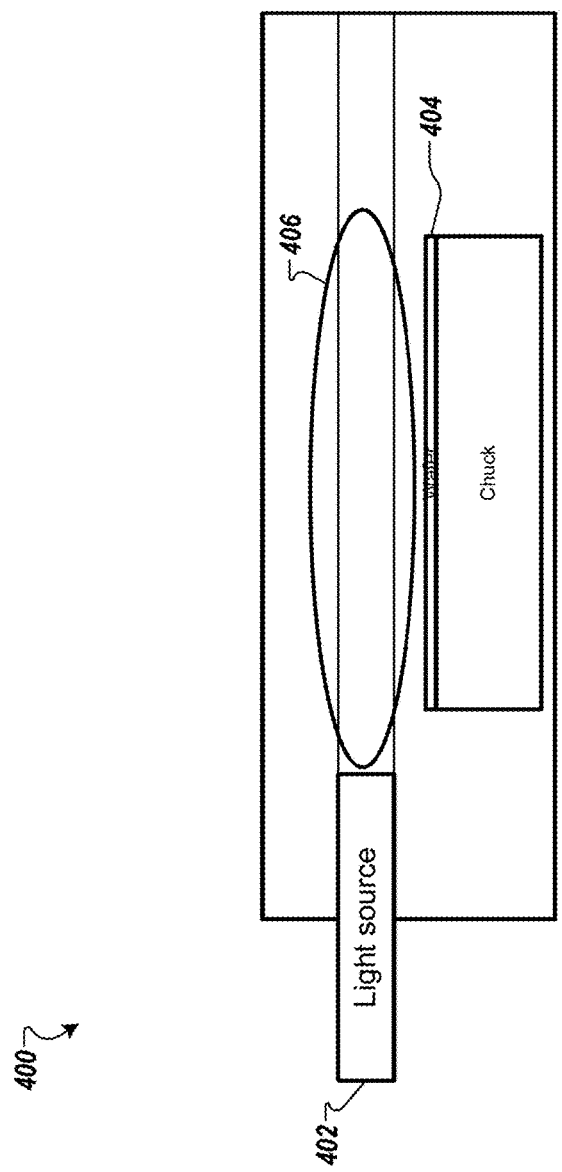
FIG. 4 is a schematic diagram of a system for processing substrates according to one example.

FIG. 4 is a schematic diagram of a system 400 for processing substrates according to one example. A light or laser sheath 402 can be directed parallel with the working surface of the substrate 404. Thus, the substrate 404 is essentially not subjected to the UV radiation. The light sheath 402 can be of various heights and distances from the substrate 404. As such, hydroxyl radical vapor can be created immediately prior to contacting the working surface of the substrate 404 in vapor treatment region 406.

Figure 5:
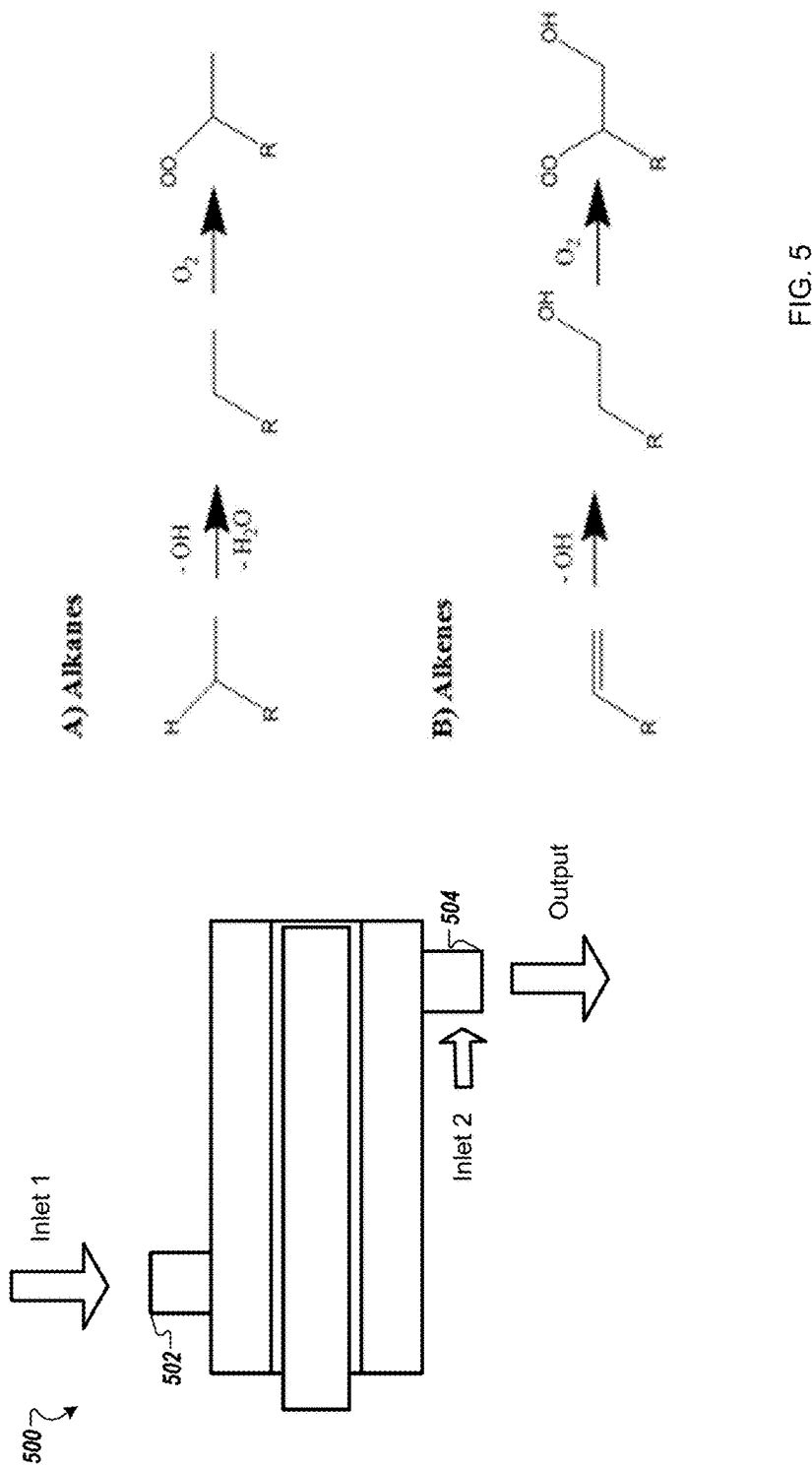
FIG. 5 is a schematic diagram of an organic peroxide delivery system according to one example.

In other embodiments, in addition to concentrated dry or wet hydrogen peroxide being delivered, an organic peroxide delivery system may be included as described in FIG. 5.

FIG. 5 is a schematic diagram of an organic peroxide delivery system 500 according to one example. The organic peroxide delivery system 500 may include one or more inlets, for example inlet 502. Alkanes or alkenes can be injected into a stream of hydrogen peroxide via inlet 502 to form organic peroxides. Organic peroxides have ability to be used as polymerizing agents (e.g., with initiated chemical vapor deposition (iCVD)) or for grafting onto surfaces to provide surface modification. One benefit of this embodiment is avoiding the use of energetic organic peroxide as a consumable, as well as avoiding delivery and storage hazards of such use. The organic peroxide radical is generated on demand in the organic peroxide delivery system 500. A secondary inlet 504 may be used to inject $O_2$, alkane, or alkene to the organic peroxide radical.

A given gas composition selected, as well as UV wavelengths used for irradiation, determines species generated. Controlling the atmosphere of steam, oxygen, nitrogen and hydrogen peroxide can control a ratio of peroxygen species that are generated/exist in a given process gas mixture after UV exposure. Examples of various oxygen/peroxygen compound reactions with UV include:

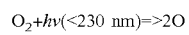
$O_2 + h\nu(<230\ nm) => 2O$

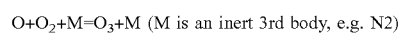
$O + O_2 + M = O_3 + M$ (M is an inert 3rd body, e.g. N2)

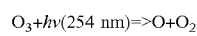
$O_3 + h\nu(254\ nm) => O + O_2$

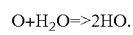
$O + H_2O => 2HO.$

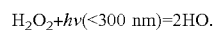
$H_2O_2 + h\nu(<300\ nm) = 2HO.$

Different peroxygen species may be favored in the processing of different carbon containing materials. Further, certain peroxygen species may be preferred at higher processing temperatures. Thus, substrate temperature can be controlled by the controller 118 in consideration of the type of peroxygen species generated. Thus, described herein are various embodiments for generating hydroxyl radical vapor. After generation, the hydroxyl radical vapor and remaining hydrogen peroxide vapor are directed to the working surface of the substrate such that hydroxyl radical vapor contacts the layer of carbon-containing material. Sufficient hydroxyl radical vapor can be directed to the working surface of the substrate to oxidize the layer of carbon containing material into a gaseous state, or otherwise modify the layer of organic material.

In other embodiments, sufficient hydroxyl radical vapor is directed to the working surface of the substrate such that oxygen and hydrogen are added into a carbon structure of the carbon-containing material. Thus, the carbon-containing layer is chemically modified but remains in place instead of being mineralized to $H_2O$ and $CO_2$ and removed in the vapor phase.

Such a modification can enable subsequent removal using UV treated air. Directing the hydroxyl radical vapor to the working surface of the substrate can include maintaining the substrate at less than 260 degrees Celsius, or even less than 100 degrees Celsius, or at and below the condensation temperature of the hydrogen peroxide vapor for the given pressure of the process chamber. For example, the pressure may range from 6 mTorr to 20 Torr.

Accordingly, oxidized carbon-containing material can be removed from the processing chamber after becoming volatile. For example, a pump or vacuum system can be used to remove carbon-containing material from the processing chamber after oxidation.

Figure 6:
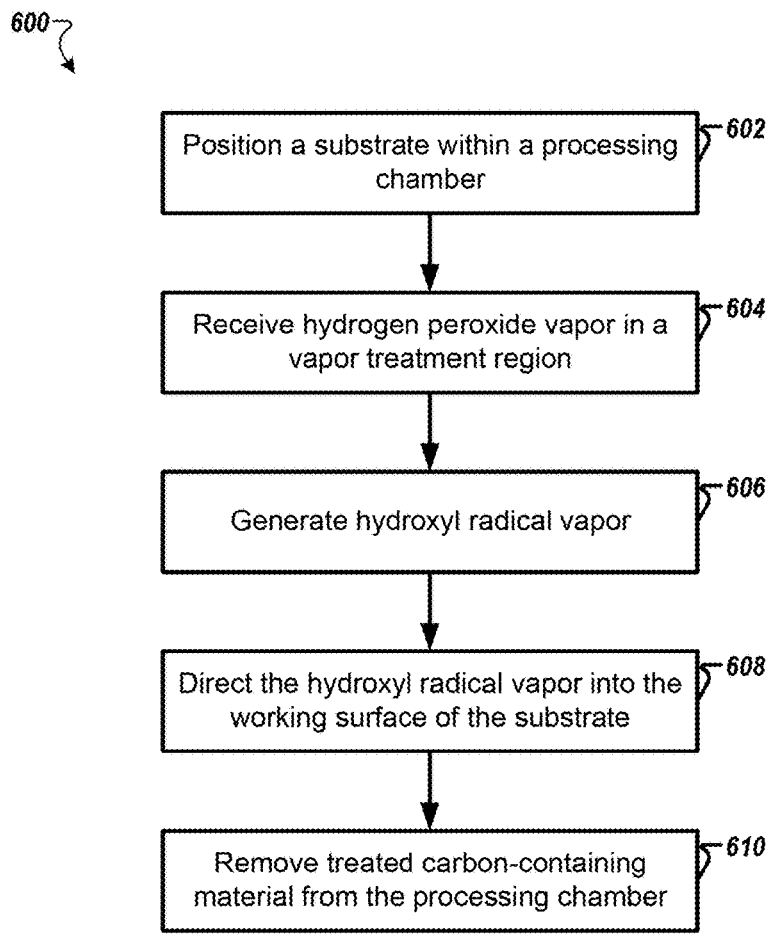
FIG. 6 is a flowchart that shows a method for processing substrates according to one example.

FIG. 6 is a flowchart that shows a method 600 for processing substrates according to one example. A substrate is positioned within a processing chamber of a substrate processing system (602). The substrate may include a layer of a carbon-containing material on a working surface of the substrate. The carbon-containing material may include amorphous carbon, photoresist, spin-on-carbon, and post-etch polymer residue.

As described previously herein, the vapor treatment region may be a region above the substrate (e.g., the system 100 of FIG. 1 or 4). In one implementation, the vapor treatment region may be outside of the processing chamber. For example the vapor treatment region may include a quartz conduit that is configured to receive a UV light or radiation (e.g., exposure chambers of FIG. 2 or 3).

In one example, the substrate may be maintained at a predetermined temperature. The predetermined may be a temperature that is below a condensation temperature of the hydrogen peroxide vapor for a given pressure of the processing chamber. In one example, the substrate may be maintained at less than 100 degrees Celsius.

Hydrogen peroxide vapor is received in a vapor treatment region of the substrate processing system (604). In one embodiment, the vapor treatment region is maintained at atmospheric pressure. Further, the hydrogen peroxide vapor may be received with a carrier gas. The concentration of the hydrogen peroxide vapor may be between 1-40%. For example, a high concentration may be used for organic removal reactions.

Hydroxyl radical vapor is generated by treating the hydrogen peroxide vapor in the vapor treatment region (606). Treating the hydrogen peroxide vapor may include exposing the hydrogen peroxide vapor to sufficient UV radiation. Sufficient UV radiation is an amount to create hydroxyl radical vapor from the hydrogen peroxide vapor as would be understood by one of ordinary skill in the art.

In one embodiment, the source of the UV radiation is positioned such that the substrate is essentially not exposed to the UV radiation, for example, as shown in FIG. 4.

The hydroxyl radical vapor and remaining hydrogen peroxide vapor are directed to the working surface of the substrate such that sufficient hydroxyl radical vapor contacts the layer of carbon-containing material causing the carbon-containing material to be chemically modified (608). Sufficient hydroxyl radical vapor may be such as the substrate is exposed to the vapor for less than five minutes and preferably less than two minutes. In one implementation, the substrate is exposed to the vapor for less than thirty seconds. Oxygen and hydrogen are added into a carbon structure of the carbon-containing material. For example, the carbon-containing material is oxidized into a gaseous state.

In one implementation, the hydroxyl radical vapor directed to the substrate 104 is sufficient to partially oxidize the layer of carbon-containing material.

Oxidized carbon-containing material is removed from the processing chamber (610).

In one implementation, an alkane or alkene is also input in the vapor treatment region of the substrate processing system. Thus, organic peroxide is generated by treating the alkane or alkene in the vapor treatment region by exposing the alkane or alkene to the UV radiation.

Figure 7:
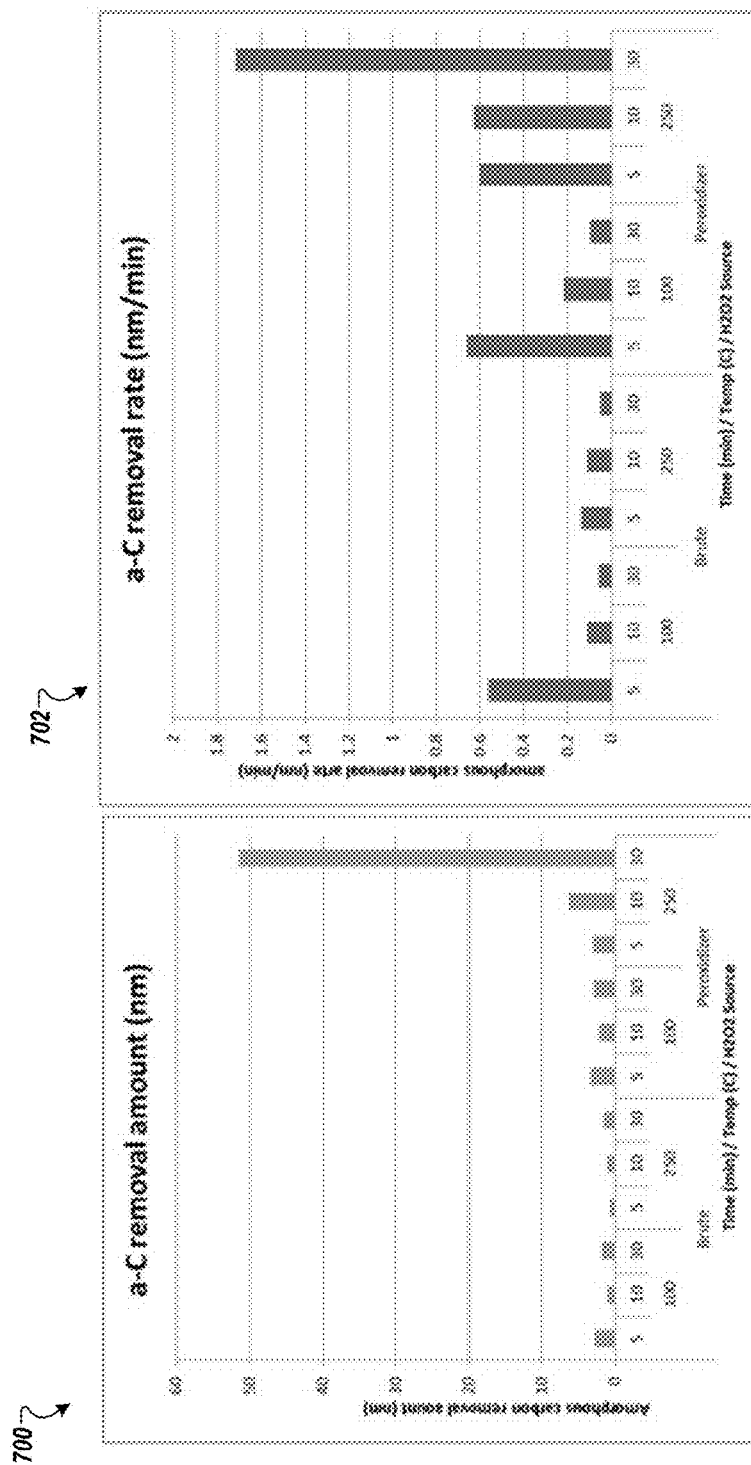
FIG. 7 is a schematic that shows exemplary results according to one example.

FIG. 7 is a schematic that shows exemplary results according to one example. Graph 700 shows an amorphous carbon removal amount in nanometer for Brutus (i.e., high concentration hydrogen peroxide gas (dry) and peroxidizer (i.e., high concentration hydrogen peroxide gas (concentrates $H_2O_2$: DIW mixtures). Graph 702 shows an amorphous carbon removal rate for Brutus and peroxidizer with variation in temperature and time. Peroxide is supplied as point of use source into a heated tube reactor. The Brutus hydrogen peroxide shows low removal amount. Brutus is a high concentration dry source of hydrogen peroxide (no water vapor). The peroxidizer hydrogen peroxide showed significant activity at 250 C as shown inGraphs 700 and 702.

Figure 8:
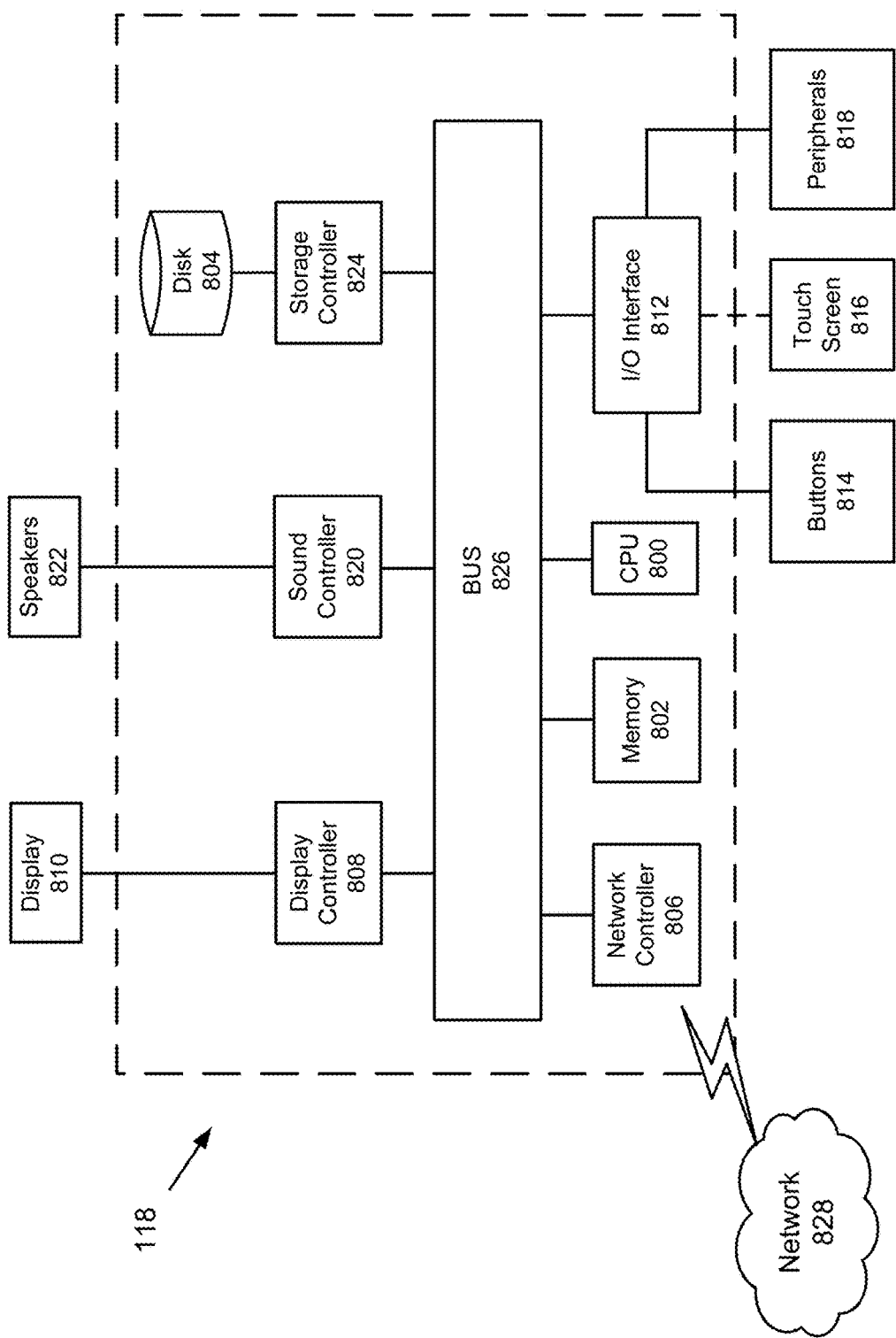
FIG. 8 is an exemplary block diagram of a controller according to one example.

Next, a hardware description of the controller 118 according to exemplary embodiments is described with reference to FIG. 8. In FIG. 8, the controller 118 includes a CPU 800 which performs the processes described herein. The process data and instructions may be stored in memory 802. These processes and instructions may also be stored on a storage medium disk 804 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the controller 118 communicates, such as a server or computer.

Further, the claimed advancements may be provided as a utility application, background daemon, or component of an operating system, or combination thereof, executing in conjunction with CPU 800 and an operating system such as Microsoft® Windows®, UNIX®, Oracle® Solaris, LINUX®, Apple macOS™ and other systems known to those skilled in the art.

In order to achieve the controller 118, the hardware elements may be realized by various circuitry elements, known to those skilled in the art. For example, CPU 800 may be a Xenon or Core processor from Intel of America or an Opteron processor from AMD of America, or may be other processor types that would be recognized by one of ordinary skill in the art. Alternatively, the CPU 800 may be implemented on an FPGA, ASIC, PLD or using discrete logic circuits, as one of ordinary skill in the art would recognize. Further, CPU 800 may be implemented as multiple processors cooperatively working in parallel to perform the instructions of the inventive processes described above.

The controller 118 in FIG. 8 also includes a network controller 806, such as an Intel Ethernet PRO network interface card from Intel Corporation of America, for interfacing with network 828. As can be appreciated, the network 828 can be a public network, such as the Internet, or a private network such as LAN or WAN network, or any combination thereof and can also include PSTN or ISDN sub-networks. The network 828 can also be wired, such as an Ethernet network, or can be wireless such as a cellular network including EDGE, 3G and 4G wireless cellular systems. The wireless network can also be WiFi®, Bluetooth®, or any other wireless form of communication that is known.

The controller 118 further includes a display controller 808, such as a NVIDIA® GeForce® GTX or Quadro® graphics adaptor from NVIDIA Corporation of America for interfacing with display 810, such as a Hewlett Packard® HPL2445w LCD monitor. A general purpose I/O interface 812 interfaces with a keyboard and/or mouse 814 as well as a an optional touch screen panel 816 on or separate from display 810. General purpose I/O interface also connects to a variety of peripherals 818 including printers and scanners, such as an OfficeJet® or DeskJet® from Hewlett Packard.

A sound controller 820 is also provided in the controller 118, such as Sound Blaster® X-Fi Titanium® from Creative, to interface with speakers/microphone 822 thereby providing sounds and/or music.

The general purpose storage controller 824 connects the storage medium disk 804 with communication bus 826, which may be an ISA, EISA, VESA, PCI, or similar, for interconnecting all of the components of the controller 118. A description of the general features and functionality of the display 810, keyboard and/or mouse 814, as well as the display controller 808, storage controller 824, network controller 806, sound controller 820, and general purpose I/O interface 812 is omitted herein for brevity as these features are known.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details.

Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for processing substrates, the method comprising:
    positioning a substrate within a processing chamber of a substrate processing system, the substrate including a layer of a carbon-containing material on a working surface of the substrate;
    receiving hydrogen peroxide vapor in a vapor treatment region of the substrate processing system;
    generating hydroxyl radical vapor by exposing the hydrogen peroxide vapor to radiation in the vapor treatment region without the radiation reaching the working surface of the substrate; and
    directing the hydroxyl radical vapor and remaining hydrogen peroxide vapor to the working surface of the substrate causing the carbon-containing material to be chemically modified, wherein directing the hydroxyl radical vapor to the working surface of the substrate includes maintaining the substrate at less than 100 degrees Celsius.

2. The method of claim 1, wherein sufficient hydroxyl radical vapor contacts the layer of carbon-containing material causing the carbon-containing material to be oxidized into a gaseous state.

3. The method of claim 2, further comprising
    removing oxidized carbon-containing material from the processing chamber.

4. The method of claim 1, wherein exposing the hydrogen peroxide vapor includes exposing the hydrogen peroxide vapor to ultraviolet radiation.

5. The method of claim 4, wherein exposing the hydrogen peroxide vapor to ultraviolet radiation includes exposing the hydrogen peroxide vapor to sufficient ultraviolet radiation that the hydroxyl radical vapor is created from the hydrogen peroxide vapor.

6. A method for processing substrates, the method comprising:
    positioning a substrate within a processing chamber of a substrate processing system, the substrate including a layer of a carbon-containing material on a working surface of the substrate;
    receiving hydrogen peroxide vapor in a vapor treatment region of the substrate processing system;
    generating hydroxyl radical vapor by treating the hydrogen peroxide vapor in the vapor treatment region; and
    directing the hydroxyl radical vapor and remaining hydrogen peroxide vapor to the working surface of the substrate causing the carbon-containing material to be chemically modified, wherein directing the hydroxyl radical vapor to the working surface of the substrate includes maintaining the substrate at a temperature that is below a condensation temperature of the hydrogen peroxide vapor for a given pressure of the processing chamber.

7. The method of claim 1, wherein receiving the hydrogen peroxide vapor includes receiving the hydrogen peroxide vapor at atmospheric pressure.

8. The method of claim 1, wherein the vapor treatment region includes a region within the processing chamber above the substrate when the substrate is positioned in the processing chamber.

9. The method of claim 1, wherein the vapor treatment region is located outside of the processing chamber.

10. The method of claim 1, wherein the vapor treatment region includes a quartz conduit configured to receive ultraviolet light.

11. The method of claim 1, wherein the layer of carbon-containing material is selected from the group consisting of amorphous carbon, photoresist, spin-on-carbon, and post-etch polymer residue.

12. The method of claim 1, wherein receiving the hydrogen peroxide vapor includes receiving the hydrogen peroxide vapor with a carrier gas, and wherein a concentration of the hydrogen peroxide vapor is between 1-40%.

13. The method of claim 1, wherein directing the hydroxyl radical vapor to the working surface of the substrate includes directing sufficient hydroxyl radical vapor to partially oxidize the layer of carbon-containing material.

14. A method for processing substrates, the method comprising:

positioning a substrate within a processing chamber of a substrate processing system, the substrate including a layer of a carbon-containing material on a working surface of the substrate;

receiving hydrogen peroxide vapor in a vapor treatment region of the substrate processing system;

receiving an alkane or alkene in the vapor treatment region of the substrate processing system;

generating organic peroxide by treating the hydrogen peroxide vapor and treating the alkane or alkene in the vapor treatment region; and directing hydroxyl radical vapor, the organic peroxide and remaining hydrogen peroxide vapor to the working surface of the substrate such that hydroxyl radical vapor contacts the layer of carbon-containing material.

15. The method of claim 1, wherein exposing the hydrogen peroxide vapor to ultraviolet radiation includes positioning a source of ultraviolet radiation such that ultraviolet radiation is not directed towards the working surface of the substrate.

* * * * *